United States Patent
Zhao et al.

(10) Patent No.: US 7,742,261 B2
(45) Date of Patent: Jun. 22, 2010

(54) TUNNELING MAGNETO-RESISTIVE SPIN VALVE SENSOR WITH NOVEL COMPOSITE FREE LAYER

(75) Inventors: Tong Zhao, Milpitas, CA (US); Hui-Chuan Wang, Pleasanton, CA (US); Chyu-Jiuh Torng, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 700 days.

(21) Appl. No.: 11/034,114

(22) Filed: Jan. 12, 2005

(65) Prior Publication Data

US 2006/0152861 A1 Jul. 13, 2006

(51) Int. Cl.
G11B 5/33 (2006.01)
G11B 5/127 (2006.01)

(52) U.S. Cl. ................. 360/324.12; 360/324.2

(58) Field of Classification Search ......... 360/324, 360/324.2
See application file for complete search history.

(56) References Cited

U.S. PATENT DOCUMENTS

| | | | | |
|---|---|---|---|---|
| 5,896,252 | A | 4/1999 | Kanai | 360/113 |
| 6,127,045 | A * | 10/2000 | Gill | 428/611 |
| 6,452,204 | B1 | 9/2002 | Ishiwata et al. | 257/9 |
| 6,519,124 | B1 | 2/2003 | Redon et al. | 360/324.2 |
| 6,529,353 | B2 | 3/2003 | Shimazawa | 360/324.2 |
| 6,563,682 | B1 | 5/2003 | Sugawara et al. | |
| 6,842,317 | B2 | 1/2005 | Sugita et al. | |
| 7,390,529 | B2 * | 6/2008 | Li et al. | 427/127 |
| 7,390,530 | B2 * | 6/2008 | Wang et al. | 427/127 |
| 7,431,961 | B2 * | 10/2008 | Zhao et al. | 427/127 |
| 2002/0135923 | A1 * | 9/2002 | Gill | 360/73.03 |
| 2004/0008454 | A1 * | 1/2004 | Gill | 360/324.12 |
| 2004/0047190 | A1 | 3/2004 | Odagawa et al. | 365/200 |
| 2004/0109263 | A1 | 6/2004 | Suda et al. | 360/322 |
| 2004/0184198 | A1 | 9/2004 | Tetsukawa et al. | 360/324.1 |
| 2005/0201022 | A1 * | 9/2005 | Horng et al. | 360/324.11 |
| 2005/0243475 | A1 * | 11/2005 | Heim | 360/324.11 |
| 2005/0254181 | A1 | 11/2005 | Li et al. | 360/324.12 |

(Continued)

FOREIGN PATENT DOCUMENTS

JP 2000-058941 2/2000

(Continued)

OTHER PUBLICATIONS

Co-pending U.S. Appl. No. 11/034,113, filed Jan. 12, 2005, "Tunneling Magneto-Resistive Spin Valve Sensor with Novel Composite Free Layer", assigned to the same assignee as the current invention.

(Continued)

Primary Examiner—Andrea L Wellington
Assistant Examiner—Adam B Dravininkas
(74) Attorney, Agent, or Firm—Saile Ackerman LLC; Stephen B. Ackerman

(57) ABSTRACT

The conventional free layer in a TMR read head has been replaced by a composite of two or more magnetic layers, one of which is iron rich The result is an improved device that has a higher MR ratio than prior art devices, while still maintaining free layer softness and acceptable magnetostriction. A process for manufacturing the device is also described.

12 Claims, 2 Drawing Sheets

U.S. PATENT DOCUMENTS

2005/0264954 A1* 12/2005 Li et al. .................. 360/324.12
2006/0114621 A1* 6/2006 Wang et al. ............. 360/324.12
2006/0126231 A1* 6/2006 Zhao et al. .................. 360/324

FOREIGN PATENT DOCUMENTS

JP  2002-074626  3/2002

OTHER PUBLICATIONS

Co-pending U.S. Appl. No. 10/999,826, filed Nov. 30, 2004, "Structure and Process for Composite Free Layer," assigned to the same assignee as present invention.

Co-pending U.S. Appl. No. 10/854,651, filed May 26, 2004, "Improved Free Layer for CPP GMR Having Iron Rich NiFe", assigned to the same assignee as present invention.

"Demonstrating a Tunneling Magneto-Resistive Read Head", by Sang et al., IEEE Trans. on Mag., vol. 36, No. 5, Sep. 2000, pp. 2545-2548.

"Low-Resistance Tunnel Magnetoresistive Head," by K. Ohashi et al. IEEE Trans. on Mag., Vol. 36, No. 5, Sep. 2000, pp. 2549-2553.

"Spin Dependent Tunnel Junctions for Memory and Read-Head Applications", IEEE Trans. on Mag., vol. 36, No. 5, Sep. 2000, pp. 2796-2801.

Translation of Office Action—JP, Apr. 23, 2009, Headway Technologies, Inc.

Translation of Office Action—JP, Nov. 5, 2009, Headway Technologies Inc.

\* cited by examiner

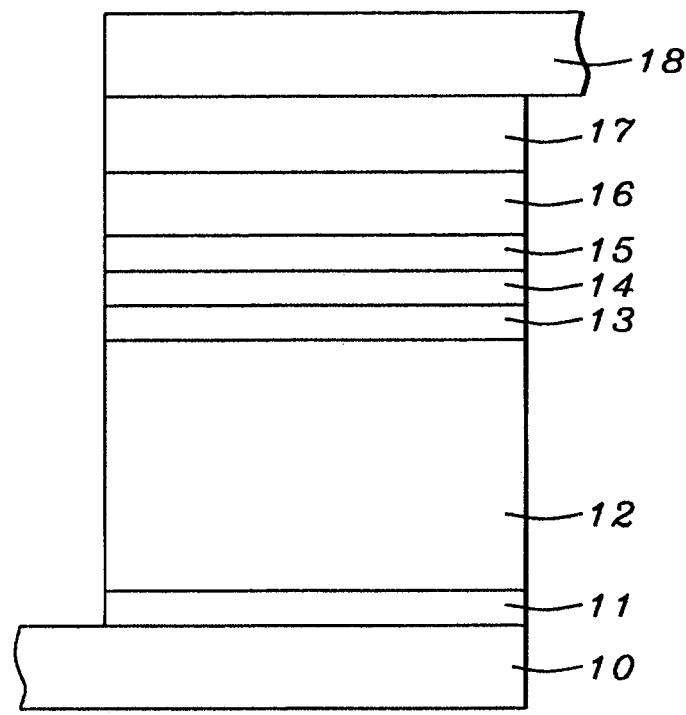
FIG. 1 – Prior Art
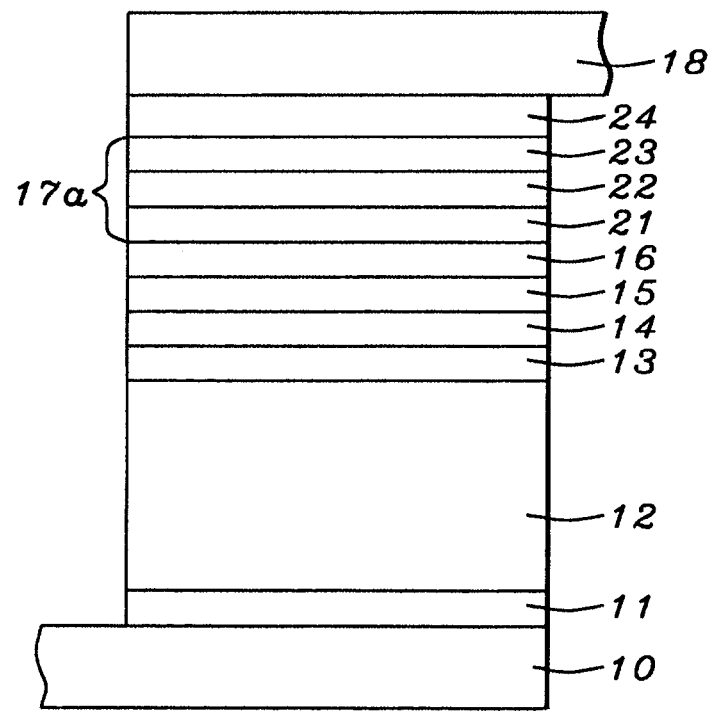
FIG. 2

TUNNELING MAGNETO-RESISTIVE SPIN VALVE SENSOR WITH NOVEL COMPOSITE FREE LAYER

This application is related to U.S. patent application Ser. No. 11/034,113 and filed Jan. 12, 2005, owned by a common assignee as the instant invention.

RELATED PATENT APPLICATION

The present application is related to application Ser. No. 10/999,826 which was filed on Nov. 30, 2004.

FIELD OF THE INVENTION

The invention relates to the general field of CPP TMR read heads with particular reference to the free layer sub-structure.

BACKGROUND OF THE INVENTION

The principle governing the operation of most magnetic read heads is the change of resistivity of certain materials in the presence of a magnetic field (magneto-resistance or MR). Magneto-resistance can be significantly increased by means of a structure known as a spin valve where the resistance increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

The key elements of a spin valve are illustrated in FIG. 1. They are seed layer 11 (lying on lower conductive lead 10) on which is antiferromagnetic layer 12 whose purpose is to act as a pinning agent for a magnetically pinned layer. The latter is a synthetic antiferromagnet formed by sandwiching antiferromagnetic coupling layer 14 between two antiparallel ferromagnetic layers 13 (AP2) and 15 (AP1).

Next is a non-magnetic spacer layer 16 on which is low coercivity (free) ferromagnetic layer 17. A contacting layer such as lead 18 lies atop free layer 17. Not shown, but generally present, is a capping layer between 17 and 18. When free layer 17 is exposed to an external magnetic field, the direction of its magnetization is free to rotate according to the direction of the external field. After the external field is removed, the magnetization of the free layer will stay at a direction, which is dictated by the minimum energy state, determined by the crystalline and shape anisotropy, current field, coupling field and demagnetization field.

If the direction of the pinned field is parallel to the free layer, electrons passing between the free and pinned layers suffer less scattering. Thus, the resistance in this state is lower. If, however, the magnetization of the pinned layer is anti-parallel to that of the free layer, electrons moving from one layer into the other will suffer more scattering so the resistance of the structure will increase. The change in resistance of a spin valve is typically 8-20%.

Earlier GMR devices were designed so as to measure the resistance of the free layer for current flowing parallel to its two surfaces. However, as the quest for ever greater densities has progressed, devices that measure current flowing perpendicular to the plane (CPP), as exemplified in FIG. 1, have also emerged. CPP GMR heads are considered to be promising candidates for the over 100 Gb/in$^2$ recording density domain (see references 1-3 below).

A related effect to the GMR phenomenon described above is tunneling magnetic resistance (TMR) in which the layer that separates the free and pinned layers is a non-magnetic insulator, such as alumina or silica. Its thickness needs to be such that it will transmit a significant tunneling current. Typically, this is around 5-20 Angstroms.

A MTJ (magnetic tunnel junction) is readily visualized by substituting a very thin dielectric layer for spacer layer 16 described above for the GMR device. The principle governing the operation of the MTJ in magnetic read sensors is the change of resistivity of the tunnel junction between two ferromagnetic layers when it is subjected to a bit field from magnetic media. When the magnetizations of the pinned and free layers are in opposite directions, the tunneling resistance increases due to a reduction in the tunneling probability. The change of resistance is typically 40%, which is much larger than for GMR devices.

With the decrease of AlOx thickness in TMR sensor, MR ratio drops with areal resistance. The present invention discloses how a higher MR ratio can be obtained while still retaining the same R.A (resistance.area product) as before. Additionally, the invention allows several of the magnetic properties of the device to be adjusted.

We note the following references to be of interest:

1. Hitoshi Kanai "Multilayer spin valve magneto-resistive effect magnetic head with free magnetic layer including two sublayers and magnetic disk drive including same", U.S. Pat. No. 5,896,252 (Apr. 20, 1999).

2. Dian Song et al., "Demonstrating a Tunneling Magneto-Resistive Read Head", IEEE Transactions On Magnetics, Vol. 36, No. 5, 2000, p 2545.

3. Ishiwata et al., "Tunneling magnetoresistance transducer and method for manufacturing the same", U.S. Pat. No. 6,452,204 (Sep. 17, 2002).

4. Hitoshi Kanai "Multilayer spin valve magneto-resistive effect magnetic head with free magnetic layer including two sublayers and magnetic disk drive including same", U.S. Pat. No. 5,896,252 (Apr. 20, 1999)

5. K. Ohashi et al. "Low-Resistance Tunnel Magnetoresistive Head" IEEE Transactions On Magnetics, Vol. 36, NO. 5, 2000, p 2549.

6. P. P. Freitas et al., "Spin-dependent Tunnel Junctions for Memory and Read-Head applications", IEEE Transactions On Magnetics, Vol. 36, No. 5, 2000, p 2796.

7. Ishiwata et al., "Tunneling magnetoresistance transducer and method for manufacturing the same", U.S. Pat. No. 6,452,204 (Sep. 17, 2002).

Composite free layers, such as Co90Fe10/Ni80Fe20, are standard structures for giant magnetoresistive (GMR) sensors of magnetic recording heads. A composite free layer usually comprises two magnetic layers, namely first free layer (FL1) and second free layer (FL2), which are directly magnetic-coupled. FL1 (usually Co-rich alloys) provide strong spin dependent scattering for higher signal, while FL2 (usually Permalloy-type NiFe material) provides magnetic softness to suppress magnetic noise. This composite free layer structure has also been used in tunneling magnetoresistive (TMR) sensors, a typical TMR structure being as follows:

Buffer layer/Antiferromagnetic layer/CoFe/Ru/CoFe/AlOx/CoFe/NiFe/Capping layer in which the Cu spacer layer of GMR structure is replaced by an AlOx layer. Compared to GMR, the advantage of TMR is higher MR ratio, which is usually larger than 20%. TMR sensors are operated in CPP (current perpendicular to plane of film) mode so that the sensor resistance will increase as the TMR sensor is scaled down in order to achieve higher recording density.

To maintain a useful sensor resistance range, the AlOx thickness has to be reduced to less than 7 Å to achieve low areal resistance, R.A, (of several ohm*μm²). However, as a consequence, the MR ratio will also drop as R.A decreases. Thus, one of the major challenges facing the TMR sensor is how to improve the MR ratio while still keeping R.A low.

Additionally, reference is made to HT04-015 (application Ser. No. 10,854,651 filed May 26, 2004) which deals with a similar problem towards which the present invention takes a different approach as well as to the following references that were found during a routine search:

U.S. Pat. No. 6,529,353 (Shimazawa et al), U.S. Pat. No. 5,896,252 (Kanai), and U.S. Pat. No. 6,519,124 (Redon et al) disclose free layers comprising CoFe and NiFe. U.S. Patent Application 2004/0047190 (Odagawa et al) describes a Ni-rich free layer. U.S. Patent Application 2004/0184198 (Tetsukawa et al) discloses a free layer comprising FeNi with Fe 5-40%. U.S. Patent Application 2004/0109263 (Suds et al) teaches a free layer comprising FeNi and a Co alloy with no disclosure of the percentage of Fe.

SUMMARY OF THE INVENTION

It has been an object of at least one embodiment of the present invention to provide a TMR magnetic read head having an improved MR ratio as well as a free layer that is magnetically soft Another object of at least one embodiment of the present invention has been to provide a process for manufacturing said read heads.

Still another object of at least one embodiment of the present invention has been that said process be compatible with existing processes for the manufacture of TMR devices.

These objects have been achieved by replacing the conventional free layer by a laminate comprising a layer that is iron rich with at least one other magnetic layer such as Permalloy. The result is an improved TMR device that has a higher GMR ratio than prior art devices, while still maintaining free layer softness and acceptable magnetostriction. A process for manufacturing the device is also described.

BRIEF DESCRIPTION OF THE DRAWINGS

FIG. 1 shows a GMR/TMR stack of the prior art which has a conventional free layer.

FIG. 2 shows a TMR stack having a modified free layer according to the teachings of the present invention.

DESCRIPTION OF THE PREFERRED EMBODIMENTS

Figure 3:
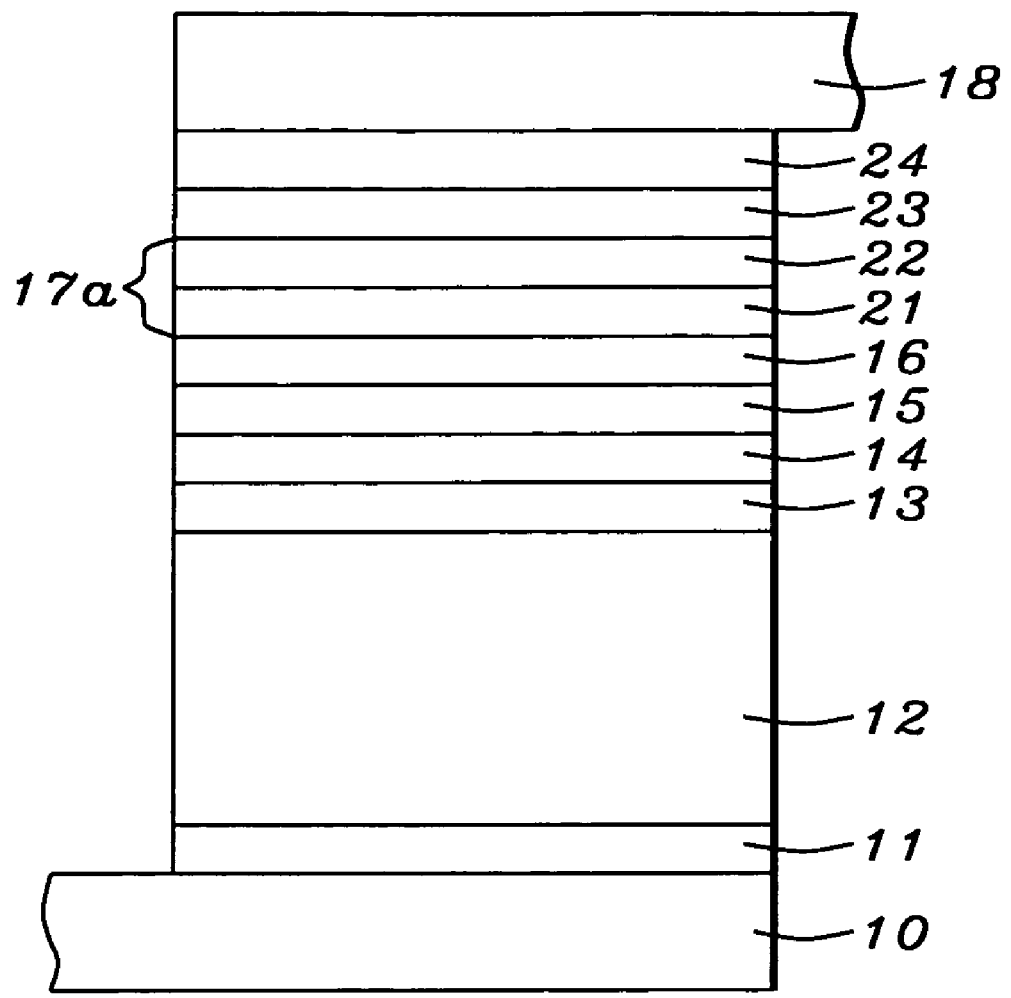
FIG. 3 illustrates an optional variation of FIG. 2 wherein the free layer is made of only two sub-layers.

In the present invention, Ni-rich NiFe is replaced with Fe-rich FeNi for FL2 in the composite free layer structure in order to obtain higher MR ratio in a TMR sensor while maintaining low R.A.

The process begins with the formation of lower lead 10 onto which is deposited seed layer 11 followed by pinning layer 12. Layer 12 comprises a suitable antiferromagnetic material such as IrMn and it is deposited to a thickness between 45 and 80 Angstroms. Layer 13 (AP2), the first of the two antiparallel layers that will form the synthetic AFM pinned layer, is then deposited onto layer 12. This is followed by layer of AFM coupling material 14 and then AP1 layer is deposited thereon.

Next, tunneling, non-magnetic, insulating layer 16 is deposited on AP1 layer 15. For the TMR design, layer 16 would be a dielectric layer of a material such as alumina between about 5 and 10 Angstroms thick.

Now follows a key feature of the invention by which the free layer 17a is made up of three sub-layers 21-23:

Layer 21, referred to as FL1, comprises one or more elements selected from the group consisting of Co, Fe, and Ni. FL2 (layer 22) is $Fe_xNi_{1-x}$, where x is between 0.6 and 0.8. Free layer 17a may be constituted from layers 21 and 22 or, optionally, additional layers (such as layer 23) could also be added. If FL2 is made up of multiple magnetic layers, one of these must contain at least 50 atomic percent of iron and be between about 2 and 80 Angstroms thick.

The process concludes with the deposition of capping layer 24 followed by upper lead layer 18, the completed structure being now ready to serve as a TMR read head.

Confirmation of the Effectiveness of the Invention:

TABLE I below compares the properties of reference TMR sample A, having a $Ni_{82}Fe_{18}$ free layer, with those of samples B and C which are GMR stacks having a $Fe_{66}Ni_{34}$ free layer. Except for FL2, the other parts of the full GMR stack have been kept the same.

TABLE I

| Sample | FL1 | FL2 | Bs | R.A | dR/R |
|---|---|---|---|---|---|
| A | 10 Å CoFe(10%) | 30 Å NiFe(18%) | 0.349 | 2.4 | 17% |
| B | 10 Å CoFe(10%) | 17 Å FeNi(34%) | 0.272 | 2.3 | 21% |
| C | 10 Å CoFe(10%) | 25 Å FeNi(34%) | 0.419 | 2.4 | 20% |

In TABLE I, 0.6 μm circle devices were used. These had a TMR structure of Seed layer\Antiferromagnetic layer\CoFe\Ru\CoFe\AlOx\FL1\FL2\Capping layer. FL2 was permalloy (Ni82Fe18) for sample A and FeNi(34 at %) for samples B and C. R.A is given in units of ohm·μm². Bs values were measured on full film samples.

It can be seen that MR ratio is significantly enhanced with the new composite free layer structure. Since the MR ratio is usually determined by the spin polarization of magnetic layers interfacing with barrier layer, the enhancement MR with new FL2 material indicates that FL2 material can affect spin polarization of FL1 through inter-diffusion or modification of band structure.

Another example of new composite free layer structure is: FL1\FeNi(34%)\NiFe(18%). By varying the relative thicknesses of FeNi(34%) and NiFe(18%), we can obtain high MR ratio, (low) adjustable magnetic softness, and suitable magnetostriction. Some examples are shown in TABLE II below:

TABLE II

| FL2 | Bs | Hc | lambda |
|---|---|---|---|
| 12CoFe(10%)/25NiFe 66%) | 0.46 | 12.47 | 8.5E−06 |
| 10CoFe(10%)/10NiFe(66%)/25NiFe(18%) | 0.47 | 4.3 | 9.0E−06 |
| 5CoFe(10%)/10NiFe(66%)/40NiFe(18%) | 0.54 | 2.9 | 7.0E−06 |

The implementation of the invention requires only a target of new material to replace current NiFe targets for GMR stack sputtering. The annealing process can be kept the same. Therefore, there is no change of the process flow and related process compared to current practice.

What is claimed is:

1. A free layer for use with a magnetic tunnel junction (MTJ), comprising:

a first free layer (FL1) comprising one or more elements selected from the group consisting of Co, Fe, and Ni; and on said FL1 layer a single second free layer (FL2) of $Fe_xNi_{1-x}$, uniform in composition over both its area and its depth, where x is greater than 0.65 and less than or equal to 0.7999, said FL1 and FL2 layers together forming said free layer.

2. The free layer described in claim 1 wherein said FL1 layer is between about 2 and 30 Angstroms thick.

3. The free layer described in claim 1 wherein said FL2 layer is between about 2 and 80 Angstroms thick.

4. A free layer for use with a magnetic tunnel junction (MTJ), comprising:

a first free layer (FL1) comprising two or more elements selected from the group consisting of Co, Fe, and Ni; and on said FL1 layer at least two magnetic layers, one of which contains at least 50 atomic percent of iron and is between about 2 and 80 Angstroms thick, said FL1 and said two or more magnetic layers together constituting said free layer.

5. The free layer described in claim 4 wherein said FL1 layer is between about 2 and 30 Angstroms thick.

6. The free layer described in claim 4 wherein said free layer is between about 10 and 110 Angstroms thick.

7. A Tunneling Magnetoresistive (TMR) read head, having a free layer, comprising:

on a lower lead layer, a seed layer and a pinning layer;

on said pinning layer, a pinned layer;

a non magnetic tunneling layer on said pinned layer;

on said non magnetic tunneling layer, a first free layer (FL1) comprising two or more elements selected from the group consisting of Co, Fe, and Ni;

on said FL1 layer, a second free layer (FL2) of $Fe_xNi_{1-x}$, where x is between 0.6 and 0.8, said FL1 and FL2 layers together constituting said free layer; and on said free layer, a capping layer and an upper lead layer.

8. The TMR read head described in claim 7 wherein said FL1 layer is between about 2 and 30 Angstroms thick.

9. The TMR read head described in claim 7 wherein said FL2 layer is between 2 and 80 Angstroms thick.

10. A Tunneling Magnetoresistive (TMR) read head, having a free layer, comprising:

on a lower lead layer, a seed layer and a pinning layer;

on said pinning layer, a pinned layer;

a non magnetic tunneling layer on said pinned layer;

on said non magnetic tunneling layer a first free layer (FL1) comprising two or more elements selected from the group consisting of Co, Fe, and Ni;

on said FL1 layer a second free layer (FL2) containing at least 50 atomic percent of iron, said FL1 and FL2 layers together constituting said free layer; and on said free layer, a capping layer and an upper lead layer.

11. The TMR read head described in claim 10 wherein said FL1 layer is between about 2 and 30 Angstroms thick.

12. The TMR read head described in claim 10 wherein said FL2 layer is between about 2 and 80 Angstroms thick.

* * * * *